(12) United States Patent
Nabekura et al.

(10) Patent No.: US 8,729,598 B2
(45) Date of Patent: May 20, 2014

(54) LIGHT-EMITTING DIODE, METHOD FOR MANUFACTURING THE SAME, AND LIGHT-EMITTING DIODE LAMP

(75) Inventors: Wataru Nabekura, Chichibu (JP); Ryouichi Takeuchi, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/577,817

(22) PCT Filed: Feb. 2, 2011

(86) PCT No.: PCT/JP2011/052172
§ 371 (c)(1),
(2), (4) Date: Aug. 8, 2012

(87) PCT Pub. No.: WO2011/096445
PCT Pub. Date: Aug. 11, 2011

(65) Prior Publication Data
US 2012/0305979 A1    Dec. 6, 2012

(30) Foreign Application Priority Data
Feb. 8, 2010 (JP) ................. 2010-025352

(51) Int. Cl.
*H01L 33/00* (2010.01)

(52) U.S. Cl.
USPC ............... 257/103; 257/94; 257/98; 257/99; 257/E33.006; 257/E33.032; 257/E33.031; 257/E33.026; 257/E33.068

(58) Field of Classification Search
USPC ........ 257/94, 98, 99, 103, E33.006, E33.026, 257/E33.031, E33.032, E33.068
See application file for complete search history.

(56) References Cited

U.S. PATENT DOCUMENTS

| 6,229,160 B1 | 5/2001 | Krames et al. |
| 2005/0093016 A1 | 5/2005 | Yamamoto et al. |

(Continued)

FOREIGN PATENT DOCUMENTS

| JP | 6-302857 A | 10/1994 |
| JP | 2004-289047 A | 10/2004 |

(Continued)

OTHER PUBLICATIONS

International Search Report for PCT/JP2011/052172 dated Apr. 26, 2011.
Taiwanese Office Action dated Jul. 8, 2013, issued in Taiwanese Patent Application No. 100103557.

*Primary Examiner* — Victor A Mandala
(74) *Attorney, Agent, or Firm* — Sughrue Mion, PLLC

(57) ABSTRACT

The present invention provides a light-emitting diode that includes two electrodes provided on a light-emitting surface, and exhibits high light extraction efficiency and high-brightness. The present invention relates to a light-emitting diode (1) including: a compound semiconductor layer (2) including a light-emitting portion (7) containing a light-emitting layer (10); and a transparent substrate (3), wherein the compound semiconductor layer (2) and the transparent substrate (3) are bonded, and a first electrode (4) and a second electrode (5) are provided on the side of a main light-emitting surface (2a) of the compound semiconductor layer (2), wherein the transparent substrate (3) includes: an upper surface (3A) bonding to the compound semiconductor layer (2); a bottom surface (3B) having smaller dimensions than dimensions of the upper surface (3A); and a side surface including at least inclined surface (3b) inclined from the side of the upper surface toward the side of the bottom surface, wherein the first and second electrodes (4) and (5) are disposed within a region in which the bottom surface (3B) is projected when viewed from the top of the light-emitting diode.

16 Claims, 5 Drawing Sheets

(56) References Cited

U.S. PATENT DOCUMENTS

| | | | |
|---|---|---|---|
| 2006/0038195 A1* | 2/2006 | Pan et al. | 257/98 |
| 2006/0108598 A1* | 5/2006 | Lai et al. | 257/103 |
| 2008/0258130 A1* | 10/2008 | Bergmann et al. | 257/13 |
| 2009/0008661 A1 | 1/2009 | Arimitsu | |
| 2009/0127578 A1 | 5/2009 | Masuya | |
| 2009/0206359 A1* | 8/2009 | Nabekura | 257/103 |
| 2009/0278148 A1 | 11/2009 | Nabekura et al. | |
| 2010/0159622 A1* | 6/2010 | Hsieh et al. | 438/29 |
| 2011/0133238 A1* | 6/2011 | Nabekura et al. | 257/98 |
| 2011/0220948 A1* | 9/2011 | Yoo | 257/98 |
| 2012/0021543 A1* | 1/2012 | Camras et al. | 438/27 |
| 2012/0091491 A1* | 4/2012 | Jacob et al. | 257/98 |

FOREIGN PATENT DOCUMENTS

| | | | |
|---|---|---|---|
| JP | 2005-142278 A | | 6/2005 |
| JP | 2007-194536 | * | 2/2007 |
| JP | 2007-173551 A | | 7/2007 |
| JP | 2007-173575 A | | 7/2007 |
| JP | 2007-194536 A | | 8/2007 |
| JP | 2007-214225 A | | 8/2007 |
| JP | 2007-220709 A | | 8/2007 |
| TW | 200739968 | | 10/2001 |
| TW | 200742127 | | 11/2007 |

* cited by examiner

US 8,729,598 B2

LIGHT-EMITTING DIODE, METHOD FOR MANUFACTURING THE SAME, AND LIGHT-EMITTING DIODE LAMP

CROSS REFERENCE TO RELATED APPLICATIONS

This application is a National Stage of International Application No. PCT/JP2011/052172 filed Feb. 2, 2011, claiming priority based on Japanese Patent Application No. 2010-02532 filed Feb. 8, 2010, the contents of all which are incorporated herein by reference in their entirety.

TECHNICAL FIELD

The present invention relates to a light-emitting diode, a method for manufacturing the same, and a light-emitting diode lamp.

BACKGROUND ART

Hitherto, as a light-emitting diode (LED) that emits infrared light, or red, orange, yellow, or yellow-green visible light, a compound semiconductor LED has been known which is provided with a light-emitting layer composed of aluminum, gallium and indium phosphide (with empirical formulas of $(Al_XGa_{1-X})_YIn_{1-Y}P$; $0 \leq X \leq 1$, $0 < Y \leq 1$), $Al_XGa_{1-X}As(0 \leq X \leq 1)$, or $In_XGa_{1-X}As(0 \leq X \leq 1)$. In such an LED, a light-emitting portion provided with the light-emitting layer composed of $(Al_XGa_{1-X})_YIn_{1-Y}P$ ($0 \leq X \leq 1$, $0 < Y \leq 1$) is formed on a substrate material, such as gallium arsenide (GaAs) which is, in general, optically opaque to light emitted from the light-emitting layer and is also not very strong mechanically.

Therefore, in recent years, in order to produce a light-emitting diode with higher luminance and higher output, technologies have been disclosed in which the GaAs substrate material is removed, and then an GaP substrate that is capable of transmitting light emitted is joined, and an inclined surface is formed on a side surface so as to constitute a light-emitting diode increased in the luminance (refer to, for example, PTL 1 to 5).

DOCUMENTS OF RELATED ART

Patent Literature

[Patent Document 1] Japanese Unexamined Patent Application, First Publication No. Hei 6-302857
[Patent Document 2] Japanese Unexamined Patent Application, First Publication No. 2007-173551
[Patent Document 3] Japanese Unexamined Patent Application, First Publication No. 2007-173575
[Patent Document 4] Japanese Unexamined Patent Application, First Publication No. 2007-194536
[Patent Document 5] U.S. Pat. No. 6,229,160

SUMMARY OF INVENTION

Technical Problem

However it is possible to provide a high-brightness LED by the transparent substrate junction-type LED, further more high-brightness LED has been needed. In addition, in an element having a structure in which electrodes are formed on the front and rear surfaces of the light-emitting diode, many structures have been proposed. However, a structure of element in which two electrodes are formed on the light-emitting surface has a complicated shape, and the shape of a side surface thereof and dispositions of electrodes have not been optimized.

The invention has been made in view of the above-mentioned problems and an object of the invention is to provide a light-emitting diode that includes two electrodes provided on a light-emitting surface, and exhibits high light extraction efficiency and high-brightness.

Solution to Problem

That is, the invention relates to the following:
[1] A light-emitting diode including: a compound semiconductor layer including a light-emitting portion containing a light-emitting layer consisting of a composition formula $(Al_XGa_{1-X})_YIn_{1-Y}P$ ($0 \leq X \leq 1$, $0 < Y \leq 1$), $Al_XGa_{1-X}As$ ($0 \leq X \leq 1$), or $In_XGa_{1-X}As(0 \leq X \leq 0.3)$; and a transparent substrate, wherein the compound semiconductor layer and the transparent substrate are bonded, and a first electrode and a second electrode having a polarity different from that of the first electrode are provided on the side of a main light-emitting surface of the compound semiconductor layer, wherein the transparent substrate includes: an upper surface bonding to the compound semiconductor layer; a bottom surface having smaller dimensions than dimensions of the upper surface; and a side surface including at least inclined surface inclined from the side of the upper surface toward the side of the bottom surface, wherein the first and second electrodes are disposed within a region in which the bottom surface is projected when viewed from the top of the light-emitting diode.
[2] The light-emitting diode according to above [1], wherein the side surface of the transparent substrate includes: a first side surface, being substantially vertical to the light-emitting surface, in the side of the upper surface bonding the compound semiconductor layer; and a second side surface, inclined to the light-emitting surface, in the side of the bottom surface.
[3] The light-emitting diode according to above [2], wherein the first and second electrodes are not disposed within a region in which the second side surface is projected when viewed from the top of the light-emitting diode.
[4] The light-emitting diode according to any one of above [1] to [3], wherein the dimensions of the bottom surface is in a range of 60% to 80% for the dimensions of the upper surface.
[5] The light-emitting diode according to any one of above [1] to [4], wherein the area of the bottom surface is 0.04 mm$^2$ or more.
[6] The light-emitting diode according to any one of above [1] to [5], wherein the transparent substrate is GaP single crystal.
[7] The light-emitting diode according to any one of above [1] to [6], wherein the transparent substrate has the thickness of 50 µm to 300 µm.
[8] The light-emitting diode according to any one of above [2] to [7], wherein the angle between the second side surface and the light-emitting surface is in a range of 60° to 80°.
[9] The light-emitting diode according to any one of above [2] to [8], wherein the length of the first side surface in the vertical direction thereof is longer than the length of the second side surface in the inclined direction thereof, when viewed in the cross-section of the light-emitting diode.
[10] The light-emitting diode according to any one of above [1] to [9], wherein the first electrode includes a pad electrode and a linear electrode with a width equal to or less than 10 µm.

[11] The light-emitting diode according to any one of above [1] to [10], wherein the compound semiconductor layer includes a GaP layer, and the second electrode is provided on the GaP layer.

[12] The light-emitting diode according to any one of above [1] to [11], wherein the polarity of the first electrode is negative, and the polarity of the second electrode is positive.

[13] The light-emitting diode according to any one of above [2] to [12], wherein the second side surface is roughened.

[14] A method of producing a light-emitting diode, the method including: forming a compound semiconductor layer including a light-emitting portion containing a light-emitting layer consisting of a composition formula $(Al_XGa_{1-X})_YIn_{1-Y}P$ ($0 \leq X \leq 1$, $0 < Y \leq 1$), $Al_XGa_{1-X}As$ ($0 \leq X \leq 1$), or $In_XGa_{1-X}As$ ($0 \leq X \leq 0.3$) on a GaAs substrate; bonding the compound semiconductor layer and a transparent substrate; removing the GaAs substrate; forming a first electrode and a second electrode having a polarity different from that of the first electrode on a main light-emitting surface which is in the opposite side of the transparent substrate of the compound semiconductor layer; and forming an inclined surface on a side surface of the transparent substrate, wherein in forming the inclined surface, the inclined surface is formed on a side surface of the transparent substrate such that a bottom surface of the transparent substrate has smaller dimensions than dimensions of an upper surface thereof bonding to the compound semiconductor layer, and such that the first and second electrodes are disposed within a region in which the bottom surface is projected when viewed from the top of the light-emitting diode.

[15] The method of producing a light-emitting diode according to above [14], wherein in forming the inclined surface, a first side surface being substantially vertical to the light-emitting surface is formed in the side of the upper surface of the transparent substrate bonding the compound semiconductor layer, and a second side surface inclined to the light-emitting surface is formed in the side of the bottom surface.

[16] The method of producing a light-emitting diode according to above [14] or [15], wherein in forming the inclined surface, dicing method is used.

[17] A light-emitting diode lamp, which mounts a light-emitting diode according to any one of above [1] to [13].

Advantageous Effects of Invention

The light-emitting diode of the invention includes a first electrode and a second electrode having a polarity different from that of the first electrode are provided on the side of a main light-emitting surface of a compound semiconductor layer, and a transparent substrate includes: an upper surface bonding to the compound semiconductor layer; a bottom surface having smaller dimensions than dimensions of the upper surface; and a side surface including at least inclined surface inclined from the side of the upper surface toward the side of the bottom surface, wherein the first and second electrodes are disposed within a region in which the bottom surface is projected when viewed from the top of the light-emitting diode. In this manner, opaque electrodes are not formed in a region (that is, a region in which the inclined surface is projected) except a bottom surface, which exhibits high light extraction efficiency. As a result, since effective dimensions of a reflection surface can be ensured, it is possible to enhance the light extraction efficiency of the light-emitting portion. Therefore, it is possible to provide a high luminance light-emitting diode.

According to the method of the invention for producing a light-emitting diode, in forming the inclined surface on a side surface of a transparent substrate bonded to a compound semiconductor layer, the inclined surface is formed on the side surface of the transparent substrate such that a bottom surface of the transparent substrate has smaller dimensions than dimensions of an upper surface thereof bonding to the compound semiconductor layer, and such that first and second electrodes are disposed within a region in which the bottom surface is projected when viewed from the top of the light-emitting diode. Therefore, it is possible to produce the above-described high luminance light-emitting diode.

According to the light-emitting diode lamp of the invention, since the above light emitting diode of the present invention is mounted, it is possible to provide a high luminance light-emitting diode lamp.

DESCRIPTION OF EMBODIMENTS

Hereinafter, a light-emitting diode according to an embodiment of the invention and a light-emitting diode lamp mounting the light-emitting diode will be described in detail with reference to the accompanying drawings. The following drawings are for ease of understanding of characteristics. Therefore, in some cases, a characteristic portion is enlarged for convenience. For example, the scale and dimensions of each component may be different from the actual scale and dimensions.

<Light-Emitting Diode>

Figure 1:
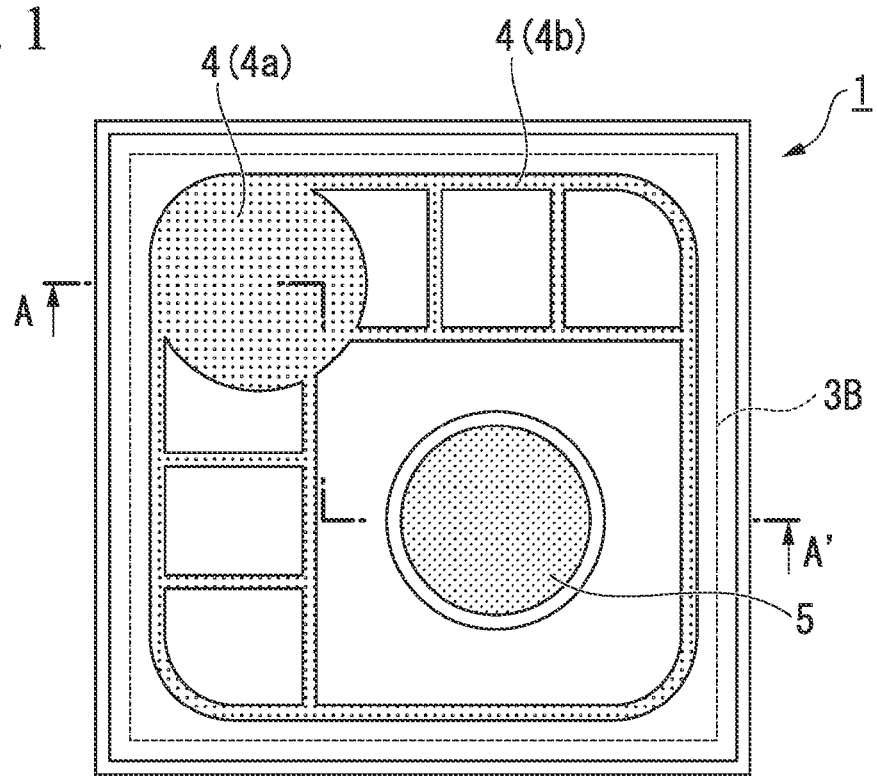
FIG. 1 is a plan view illustrating a light-emitting diode according to an embodiment of the invention.
Figure 2:
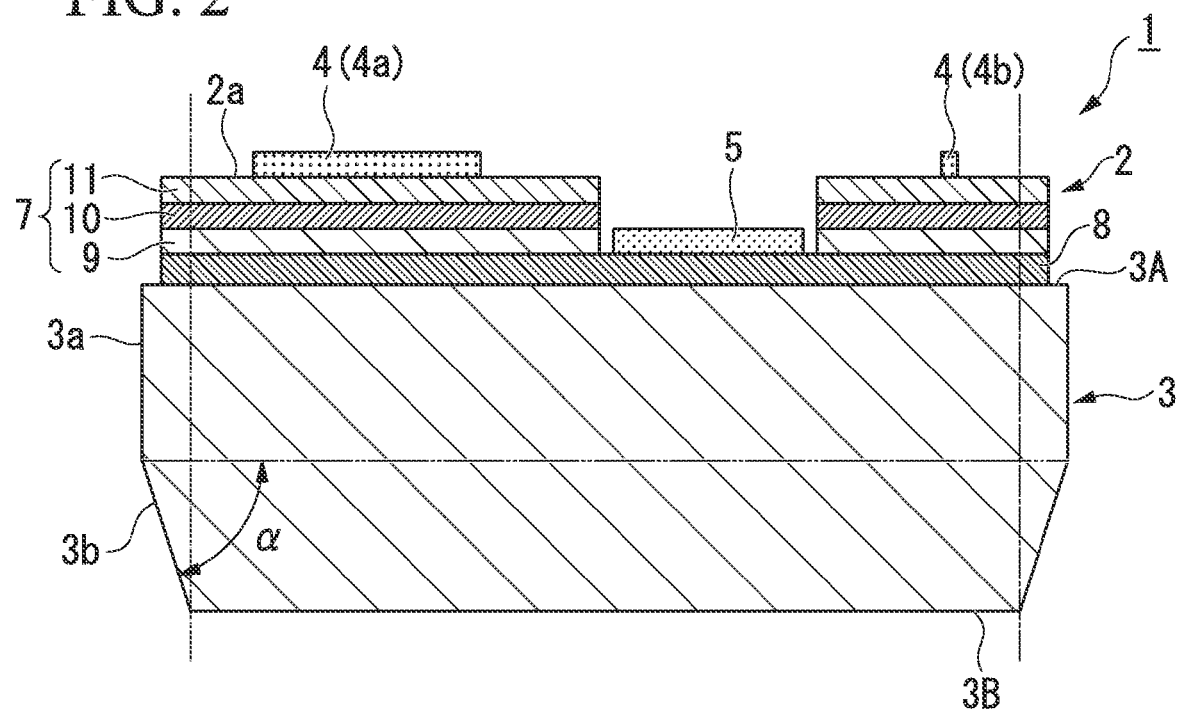
FIG. 2 is a cross-sectional view schematically illustrating a light-emitting diode according to an embodiment of the invention taken along the line A-A' of FIG. 1.

FIGS. 1 and 2 are diagrams illustrating a light-emitting diode according to an embodiment of the invention. FIG. 1 is a plan view and FIG. 2 is a cross-sectional view taken along the line A-A' of FIG. 1.

As shown in FIGS. 1 and 2, a light-emitting diode 1 of the present embodiment is a light-emitting diode in which a compound semiconductor layer 2 and a transparent substrate 3 are bonded. The light-emitting diode 1 includes an n-type ohmic electrode (first electrode) 4 and a p-type ohmic electrode (second electrode) 5 which are provided in main light-emitting surface 2a. In this embodiment, the main light-emitting surface 2a is a surface opposite to the surface of the compound semiconductor layer 2 to which the transparent substrate 3 is attached.

As shown in FIG. 2, the compound semiconductor layer (also refer to an epitaxially grown layer) 2 is a laminated structure body in which a pn-junction-type light-emitting portion 7 consisting of aluminum, gallium and indium phosphide mixed crystal (composition formula $(Al_XGa_{1-X})_Y In_{1-Y}P$; $0 \leq X \leq 1$, $0 < Y \leq 1$) layer, aluminum, gallium and arsenicum mixed crystal (composition formula $Al_XGa_{1-X}As$ ($0 \leq X \leq 1$)) layer, or indium, gallium and arsenicum mixed crystal (composition formula $In_XGa_{1-X}As$ ($0 \leq X \leq 0.3$)) layer; and an electric current diffusion layer 8 for diffusing an element driving current on the entire plane of a light-emitting portion are sequentially laminated. A known functional layer can arbitrarily be added to the structure of the compound semiconductor layer 2. For example, a known layer structure including a contact layer for reducing the contact resistance of an ohmic electrode, a current diffusion layer for diffusing an element driving current on the entire plane of a light-emitting portion, and a current blocking layer or a current confining layer for limiting the region in which the element driving current flows may be provided. The compound semiconductor layer 2 is preferably formed to be epitaxially grown on the GaAs substrate.

As shown in FIG. 2, the light-emitting portion 7 is configured so that at least a p-type lower clad layer 9, the light-emitting layer 10, and an n-type upper clad layer 11 are sequentially laminated on the electric current diffusion layer 8. That is, it is preferable that the light-emitting portion 7 have a so-called double hetero (DH) structure including the lower clad layer 9 and the upper clad layer 11 that are provided on the lower and upper sides of the light-emitting layer 10 so as to be opposite to each other in order to "confine" carriers for radiation recombination and emitted light in the light-emitting layer 10, in order to emit high-intensity light.

The light-emitting layer 10 is configured by a semiconductor layer consisting of composition formula $(Al_XGa_{1-X})_Y In_{1-Y}P$ ($0 \leq X \leq 1$, $0 < Y \leq 1$), $Al_XGa_{1-X}As$ ($0 \leq X \leq 1$) or $In_XGa_{1-X}As$ ($0 \leq X \leq 0.3$). The light-emitting layer 10 may have any one of a double heterostructure, a single quantum well (SQW) structure, and a multi-quantum well (MQW) structure. However, it is preferable that the light-emitting layer 10 have the MQW structure in order to emit good monochromatic light. In addition, the composition of $(Al_XGa_{1-X})_Y In_{1-Y}P$ ($0 \leq X \leq 1$, $0 < Y \leq 1$) forming a barrier layer and a well layer of the quantum well (QW) structure may be determined such that a quantum level capable of obtaining a desired emission wavelength is formed in the well layer.

It is preferable that the light-emitting layer 10 has a thickness of 0.02 to 2 μm. Further, a conduction type of the light-emitting layer 10 is not particularly limited, and any one of undoped, n-type or p-type can be selected. In order to enhance light emission efficiency, it is preferable that the light-emitting layer 10 is undoped or has a carrier concentration of less than $3 \times 10^{17}$ cm$^{-3}$, and has excellent crystallinity.

As shown in FIG. 2, the lower clad layer 9 and the upper clad layer 11 are provided on a lower surface and an upper surface of the light-emitting layer 10, respectively. Specifically, the lower clad layer 9 is provided on the lower surface of the light-emitting layer 10, and the upper clad layer 11 is provided on the upper surface of the light-emitting layer 10.

The lower clad layer 9 and the upper clad layer 11 are configured to have different polarity each other. Further, with respect to the carrier concentration and the thickness of the lower clad layer 9 and the upper clad layer 11, a conventionally preferable range can be employed. It is preferable that the condition is optimized to enhance light emission efficiency of the light-emitting layer 10.

For specific example, it is preferable that a Mg-doped semiconductor material made of p-type $(Al_XGa_{1-X})_Y In_{1-Y}P$ ($0.3 \leq X \leq 1$, $0 < Y \leq 1$), $Al_XGa_{1-X}As$ ($0 \leq X \leq 1$), or $In_XGa_{1-X}As$ ($0 \leq X \leq 0.3$) be used as the lower clad layer 9. Further, it is preferable that the lower clad layer 9 have a carrier concentration of $2 \times 10^{17}$ to $2 \times 10^{18}$ cm$^{-3}$ and a thickness of 0.5 μm to 5 μm.

It is preferable that a Si-doped semiconductor material made of n-type $(Al_XGa_{1-X})_Y In_{1-Y}P$ ($0.3 \leq X \leq 1$, $0 < Y \leq 1$), $Al_XGa_{1-X}As$ ($0 \leq X \leq 1$), or $In_XGa_{1-X}As$ ($0 \leq X \leq 0.3$) be used as the upper clad layer 11. Further, it is preferable that the upper clad layer 11 have a carrier concentration of $1 \times 10^{17}$ to $1 \times 10^{18}$ cm$^{-3}$ and a thickness of 0.5 μm to 2 μm.

The polarities of the lower clad layer 9 and the upper clad layer 11 may be appropriately selected in consideration of the element structure of the compound semiconductor layer 2.

Further, intermediate layers may be provided between the lower clad layer 9 and the light-emitting layer 10, between the light-emitting layer 10 and the upper clad layer 11, and between the upper clad layer 11 and the electric current diffusion layer 8 to slowly change band discontinuity therebetween. In this case, each of the intermediate layers is preferably made of a semiconductor material having an intermediate forbidden bandwidth between the forbidden bandwidths of the lower clad layer 9 and the light-emitting layer 10, between the forbidden bandwidths of the light-emitting layer 10 and the upper clad layer 11, and between the forbidden bandwidths of the upper clad layer 11 and the electric current diffusion layer 8, respectively.

A known layer structure including a contact layer for reducing the contact resistance of an ohmic electrode, a current diffusion layer for diffusing an element driving current on the entire plane of a light-emitting portion, and a current blocking layer or a current confining layer for limiting the region in which the element driving current flows may be provided on the structural layers of the light-emitting portion 7.

As shown in FIG. 2, the electric current diffusion layer 8 are provided in lower of the light-emitting portion 7 to diffuse an element driving current on the entire plane of a light-emitting portion 7. In this manner, the light-emitting diode 1 can uniformly emit light from the light-emitting portion 7.

As the electric current diffusion layer 8, a material having composition $(Al_XGa_{1-X})_Y In_{1-Y}P$ ($0 \leq X \leq 0.7$, $0 \leq Y \leq 1$) can be used. X depend on the element structure of the compound semiconductor layer 2, and since a material having low aluminum concentration is chemically stable, X is preferably 0.5 or less (in aluminum concentration, about 12.5% or less), and more preferably 0. Further, Y is preferably 1. That is, in terms of the electric current diffusion layer 8, aluminum concentration is preferably 25% or less, and more preferably 15% or less. It is particularly desirable that p-type GaP containing no aluminum is used.

When GaP is adapted in the electric current diffusion layer 8, by using GaP substrate as transparent substrate 3, they are readily bonded and excellent bonding strength can be achieved.

Further, the electric current diffusion layer 8 preferably has a thickness of 0.5 to 20 μm. When the thickness thereof is less than 0.5 μm, the current is insufficiently diffused. When the thickness thereof is more than 20 μm, the cost is increased by crystal growth of the thickness thereof.

The transparent substrate 3 is bonded to the surface of the compound semiconductor layer 2, which is in the opposite side of the main light-emitting surface 2a. That is, as shown in FIG. 2, the transparent substrate 3 is bonded to the side of the electric current diffusion layer 8 constituting the compound semiconductor layer 2. The transparent substrate 3 is preferably made of a material which has a sufficient strength to mechanically support the light-emitting portion 7, and which has a sufficiently wide forbidden bandwidth to transmit light emitted from the light-emitting portion 7 and is optically transparent for emission wavelength from the light-emitting layer 10. Further, the material is most preferably the same material as that of the electric current diffusion layer 8 which is bonded surface thereto for facilitating a bonding process described later.

For example, as the transparent substrate 3 gallium phosphide (GaP), aluminum gallium arsenide (AlGaAs), a group III-V compound semiconductor crystal, such as gallium nitride (GaN), a group IV semiconductor crystal, such as hexagonal or cubic silicon carbide (SiC), sapphire, glass and the like can be used.

It is preferable that the transparent substrate 3 have a thickness of, for example, about 50 μm or more in order to support the light-emitting portion 7 with mechanically sufficient strength. In addition, it is preferable that the thickness of the transparent substrate 3 be equal to or less than about 300 μm in order to facilitate the mechanical processing of the transparent substrate 3 after the transparent substrate 3 is bonded to the compound semiconductor layer 2. That is, it is most preferable that, with respect to transparence and costs, the transparent substrate 3 be an substrate made of a GaAs single crystal with a thickness that is equal to or more than about 50 μm and equal to or less than 300 μm.

As shown in FIG. 2, the side surface of the transparent substrate 3 includes a vertical surface (first side surface) 3a that is close to the compound semiconductor layer 2 and is substantially vertical to the main light-emitting surface 2a and an inclined surface (second side surface) 3b that is distanced away from the compound semiconductor layer 2 and is inclined inward with respect to the main light-emitting surface. In this way, it is possible to extract light emitted from the light-emitting layer 10 to the transparent substrate 3 to the outside. In addition, a portion of the light emitted from the light-emitting layer 10 to the transparent substrate 3 can be reflected from the vertical surface 3a and then extracted from the inclined surface 3b. The light reflected from the inclined surface 3b can be extracted from the vertical surface 3a. As such, it is possible to improve light emission efficiency with the synergistic effect of the vertical surface 3a and the inclined surface 3b. The term "substantially vertical" is a generic term that includes a gap of −5° to 5° in the vertical direction, preferably −3° to 3°, and more preferably −1° to 1°.

In this embodiment, as shown in FIG. 2, it is preferable that the angle α formed between the inclined surface 3b and a plane parallel to the light-emitting surface be in the range of 60 degrees to 80 degrees. This range makes it possible to effectively extract light reflected from the bottom of the transparent substrate 3 to the outside.

It is preferable that the width of the vertical surface 3a along the vertical direction thereof (in the thickness direction) be in the range of 30 μm to 200 μm. When the range of the vertical surface 3a is in the above-mentioned range, the vertical surface 3a can effectively return the light reflected from the bottom of the transparent substrate 3 to the light-emitting surface and it is possible to emit the light from the main light-emitting surface 2a. Therefore, it is possible to improve the light emission efficiency of the light-emitting diode 1.

Further, it is preferable that the length of the vertical surface 3a in the vertical direction thereof (in the thickness direction) is longer than the length of the inclined surface 3b in the inclined direction thereof. Accordingly, the transparent substrate 3 has larger dimensions of the bottom surface 3B. As a result, since the light-emitting diode is more stable in a die bonding process, the light-emitting diode can readily be assembled. Furthermore, the light-emitting diode has a good balance with a region in which the n-type ohmic electrode (first electrode) 4 is formed, and it is possible to increase the luminance of the light-emitting diode.

It is preferable that the inclined surface 3b of the transparent substrate 3 be roughened. When the inclined surface 3b is roughened, the effect of improving light extraction efficiency is obtained by the inclined surface 3b. That is, when the inclined surface 3b is roughened, total reflection from the inclined surface 3b is prevented and it is possible to improve the light extraction efficiency.

As described above, since the transparent substrate 3 constituting the light-emitting diode 1 of the present embodiment is provided with the inclined surface 3b on the side surface, dimensions S of the bottom surface 3B is smaller than dimensions of the upper surface 3A bonded to the compound semiconductor layer 2.

Here, in this embodiment, the dimensions of the bottom surface 3B are preferably in a range of 60 to 80% with respect to the dimensions of the upper surface 3A. When the range of the dimensions of the bottom surface 3B is in the above-mentioned range, light extraction efficiency can be enhanced.

Further, the area of the bottom surface 3B is preferably 0.04 mm$^2$ or more. Accordingly, the light-emitting diode can readily be assembled in the die bonding process.

Furthermore, the bottom surface 3B has reflectance of 90% or more with respect to emission wavelength, and can be provided with a reflection surface (not shown) disposed to face the light-emitting portion. According to this configuration, light can be efficiently extracted from the main light-emitting surface.

An example of the reflection surface includes Ag, Al, Au and the like. In addition to the reflection surface, an assembling process can be facilitated by adding an eutectic metal such as AuIn, AuGe and AuSn used in eutectic die bonding.

To prevent the electric current diffusion layer, a specular metal and the eutectic metal from mutually diffusing, for example, it is also preferable that a high melting point metal such as Ti, W and Pt, or a transparent conductive oxide such as ITO is inserted to stabilize the quality.

In some cases, a bonding interface between the compound semiconductor layer 2 and the transparent substrate 3 is a high-resistivity layer. That is, in some cases, a high-resistivity layer (not shown) is provided between the compound semiconductor layer 2 and the transparent substrate 3. The high-resistivity layer has a resistance value greater than that of the transparent substrate 3. The high-resistivity layer has a function of reducing a reverse current from the electric current diffusion layer 8 of the compound semiconductor layer 2 to the transparent substrate 3. In addition, a bonding structure that has resistance to a reverse voltage applied from the transparent substrate 3 to the electric current diffusion layer 8 is constructed. However, it is preferable that the breakdown voltage thereof be less than the reverse voltage of the pn-junction-type light-emitting portion 7.

As shown in FIG. 2, The n-type ohmic electrode 4 and the p-type ohmic electrode 5 are low-resistance ohmic contact electrodes that are provided on the main light-emitting surface 2a of the light-emitting diode 1. By the configuration such that the electrodes is in one side, it is not necessary to apply the current to the transparent substrate 3 bonded to the compound semiconductor layer 2. As a result, as the transparent substrate 3, a substrate material having high transmittance can be selected without consideration of electrical resistance thereof. Therefore, it is possible to increase the luminance of the light-emitting diode 1.

The n-type ohmic electrode 4 is provided on the upper clad layer 11 and may be made of an alloy, such as AuGe or Ni alloy/Au. The p-type ohmic electrode 5 is formed on the surface of an exposed portion of the electric current diffusion layer 8 and may be made of an alloy such as AuBe/Au or AuZn/Au.

In the light-emitting diode 1 according to this embodiment, it is preferable that the p-type ohmic electrode 5 serving as the second electrode be formed on the electric current diffusion layer 8. According to this structure, the effect of reducing the operating voltage is obtained. When the p-type ohmic electrode 5 is formed on the electric current diffusion layer 8 that is made of the p-type GaP, a good ohmic contact is obtained. Therefore, it is possible to reduce the operating voltage.

In this embodiment, it is preferable that the polarity of the first electrode be n and the polarity of the second electrode is p. According to this structure, it is possible to increase the brightness of the light-emitting diode 1. When the first electrode is a p-type, current diffusion deteriorates, which causes a reduction in brightness. In contrast, when the first electrode is an n-type electrode, current diffusion is improved and it is possible to increase the brightness of the light-emitting diode 1.

In the light-emitting diode 1 according to this embodiment, as shown in FIG. 1, it is preferable that the n-type ohmic electrode 4 and the p-type ohmic electrode 5 be diagonally arranged. In addition, it is preferable that the p-type ohmic electrode 5 be surrounded by the compound semiconductor layer 2. According to this structure, the effect of reducing the operating voltage is obtained. When the p-type ohmic electrode 5 is surrounded by the n-type ohmic electrode 4, it is easy for a current to flow in all directions. As a result, the operating voltage is reduced.

In the light-emitting diode 1 according to this embodiment, as shown in FIG. 1, it is preferable that the n-type ohmic electrode 4 be formed in a net shape, such as a honeycomb shape or a lattice shape. According to this structure, the effect of improving brightness and reliability is obtained. When the n-type ohmic electrode 4 is formed in a lattice shape, it is possible to inject a uniform current to the light-emitting layer 10. As a result, the effect of improving brightness and reliability is obtained. In the light-emitting diode 1 according to this embodiment, as shown in FIG. 1, it is preferable that the n-type ohmic electrode 4 include a pad-shaped electrode (pad electrode) 4a and a line-shaped electrode (linear electrode) 4b with a width equal to or less than 10 µm. According to this structure, it is possible to improve brightness. When the width of the linear electrode is reduced, it is possible to increase the area of an aperture in the light-emitting surface and thus improve brightness.

Here, in the light-emitting diode 1 of the present embodiment, as shown in FIG. 1, the n-type ohmic electrode 4 (4a, 4b) and the p-type ohmic electrode 5 are disposed within a region in which the bottom surface 3B is projected when viewed from the top of the light-emitting diode 1. That is, none of the electrodes are disposed within a region in which the inclined surface 3b of the transparent substrate 3 is projected when viewed from the top of the light-emitting diode 1.

In this manner, since opaque electrodes are not formed in a region (that is, a region in which the inclined surface 3b is projected) except a region in which the bottom surface 3B is projected, which exhibits high light emission efficiency presumed to be by effect of the inclined surface, a loss in emitted light is decreased. As a result, it is possible to enhance light emission efficiency of the light-emitting portion 7. Therefore, it is possible to further increase the luminance of the light-emitting diode 1.

In addition, it is necessary to diffuse current therearound by a linear electrode 4b constituting the n-type ohmic electrode (first electrode) 4. Since, a conventional structure in which only ohmic electrodes are formed near the central region exhibits weak light emission in the peripheral part of the element, remarkable effects are not expected.

<Method for Manufacturing Light-Emitting Diode>

Figure 3:
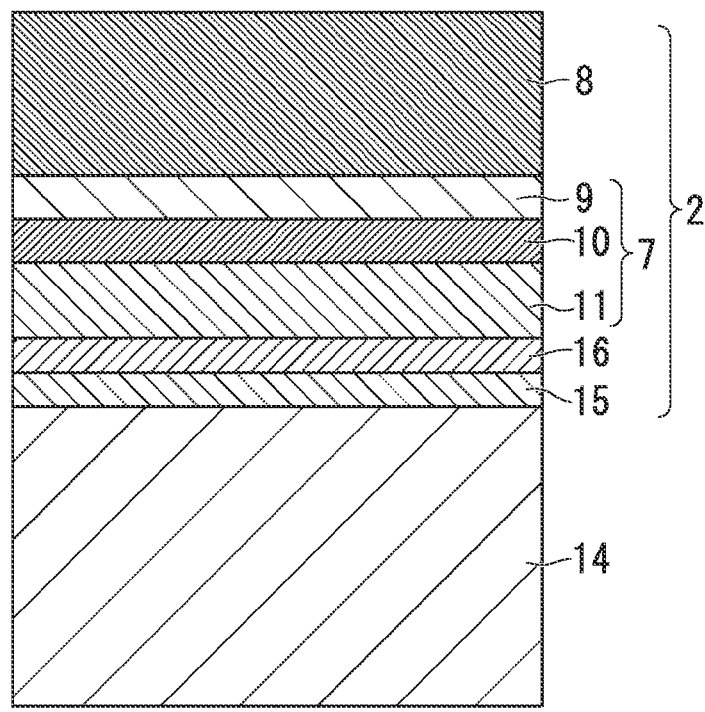
FIG. 3 is a cross-sectional view schematically illustrating an epitaxial wafer used in a light-emitting diode according to an embodiment of the invention.
Figure 4:
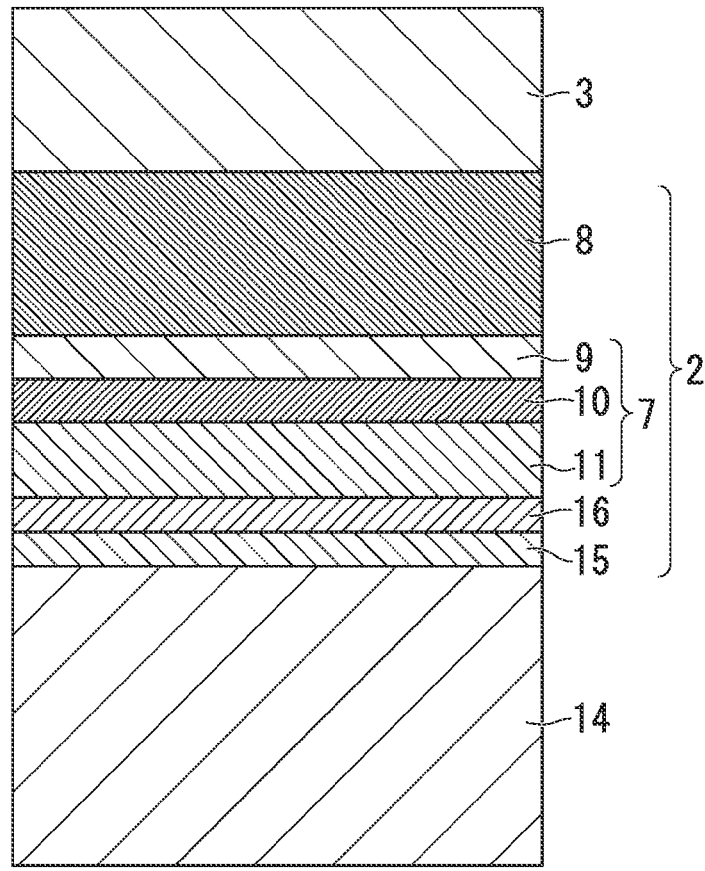
FIG. 4 is a cross-sectional view schematically illustrating a bonded wafer used in a light-emitting diode according to an embodiment of the invention.

Next, a method for manufacturing the light-emitting diode 1 of the embodiment will be described. FIG. 3 is a cross-sectional view illustrating an epitaxial wafer used in the light-emitting diode 1 according to this embodiment. FIG. 4 is a cross-sectional view illustrating a bonded wafer used in the light-emitting diode 1 according to this embodiment.

(Process of Forming Compound Semiconductor Layer)

Firstly, as shown in FIG. 3, the compound semiconductor layer 2 is manufactured. The compound semiconductor layer 2 is manufactured by sequentially laminating a GaAs buffer layer 15, an etching stop layer (not shown) provided to be used for selective etching, a Si-doped n-type AlGaInP contact layer 16, an n-type upper clad layer 11, a light-emitting layer 10, a p-type lower clad layer 9, and an electric current diffusion layer 8 that is composed of a Mg doped p-type GaP a Mg doped p-type GaP layer on a GaAs substrate 14.

As the GaAs substrate 14, a single-crystal substrate produced by a conventional method and being commercially available can be used. The surface of the GaAs substrate 14 grown epitaxially is preferably flat and smooth. The surface of the GaAs substrate 14 is readily epitaxially grown with a plane orientation. A substrate having (100) plane mass-produced and a substrate having a surface inclined within ±20° from (100) plane are preferable in terms of stability in quality. Further, in the surface of the GaAs substrate 14 grown epitaxially with a plane orientation, it is more preferable that the substrate has a surface inclined at 15°±5° from (100) plane to (0 −1 −1) plane.

The GaAs substrate 14 preferably has low dislocation density, since the compound semiconductor layer 2 has good crystallinity. As a specific example, the dislocation density thereof is 10,000 per $cm^{-2}$ or less, and preferably 1,000 per $cm^{-2}$ or less.

The GaAs substrate 14 may be n-type or p-type. The carrier concentration of the GaAs substrate 14 may be appropriately selected with respect to the desired electrical conductivity and element structure. For example, when the GaAs substrate 14 is a Si-doped n-type substrate, the carrier concentration thereof is preferably in a range of $1 \times 10^{17}$ to $5 \times 10^{18}$ $cm^{-3}$. On the other hand, when the GaAs substrate 14 is a Zn-doped p-type substrate, the carrier concentration thereof is preferably in a range of $2 \times 10^{18}$ to $5 \times 10^{19}$ $cm^{-3}$.

The GaAs substrate 14 has a range of appropriate thickness according to the size of the substrate. When the GaAs substrate 14 has a thinner thickness than the range of appropriate thickness, the GaAs substrate 14 may have cracks in a manufacturing process of the compound semiconductor layer 2. On the other hand, the GaAs substrate 14 has a thicker thickness than the range of appropriate thickness, it becomes possible to increase the costs of a material thereof. Hence, when the GaAs substrate 14 has a large substrate size, for example, when the GaAs substrate 14 has a diameter of 75 mm, the GaAs substrate 14 preferably has a thickness of 250 to 500 μm to prevent cracks during handling. Similarly, when the GaAs substrate 14 has a diameter of 50 mm, the GaAs substrate 14 preferably has a thickness of 200 to 400 μm. when the GaAs substrate 14 has a diameter of 100 mm, the GaAs substrate 14 preferably has a thickness of 350 to 600 μm.

In this manner, when the GaAs substrate 14 has a thickness according to the substrate size, the compound semiconductor layer 2 can have reduced warpage which is caused by the light-emitting layer 10. As a result, since distribution of temperature is uniform during epitaxial growth of the light-emitting layer 10, it is possible that the light-emitting layer 10 has smaller in-plane wavelength distribution. The shape of the GaAs substrate 14 is not particularly limited to a circle shape, and the GaAs substrate 14 may have a rectangle or the like.

The buffer layer (buffer) 15 is provided to reduce propagation of defects between the GaAs substrate 14 and layers constituting the light-emitting portion 7. Hence, depending on selection of quality in the substrate and conditions of the epitaxial growth, the buffer layer 15 may not be provided. Further, a material of the buffer layer 15 is preferably the same material as that of the substrate grown epitaxially. Therefore, in the embodiment, corresponding to the GaAs substrate 14, GaAs is preferably used in the buffer layer 15. Further, multilayer film consisting of the material different form that of the GaAs substrate 14 can be used in the buffer layer 15 to reduce propagation of defects. The buffer layer 15 preferably has a thickness of 0.1 μm or more, and more preferably 0.2 μm or more.

The contact layer 16 is provided to reduce the contact resistance with the electrodes. A material of the contact layer 16 is preferably a material having wider band-gap than that of the light-emitting layer 10, and $Al_XGa_{1-X}As$ and $(Al_XGa_{1-X})_YIn_{1-Y}P$ ($0 \leq X \leq 1$, $0 < Y \leq 1$) is preferable. Further, the lower limit of the carrier concentration of the contact layer 16 is preferably $5 \times 10^{17}$ cm$^{-3}$ or more, and more preferably $1 \times 10^{18}$ cm$^{-3}$ or more, to reduce contact resistance with the electrodes. The upper limit of the carrier concentration thereof is preferably $2 \times 10^{19}$ cm$^{-3}$ or less. When the carrier concentration thereof is more than the upper limit, the crystallinity thereof is readily decreased. The contact layer 16 preferably has a thickness of 0.5 μm or more, and most preferably 1 μm or more. The upper limit of the thickness of the contact layer 16 is not particularly limited, but is preferably 5 μm or less, since cost for epitaxial growth is in a appropriate range.

In the embodiment, a conventional grown method such as a Molecular Beam Epitaxicy method (MBE) or a low-pressure Metal Organic Chemical Vapor Deposition method (MOCVD method) can be used. Among these, it is particularly desirable to adapt a MOCVD method which exhibits excellent mass-productivity. Specifically, the GaAs substrate 14 used in the epitaxial growth of the compound semiconductor layer 2 is preferably subjected to a pretreatment such as a cleaning process and a thermal treatment before the epitaxial growth to remove contamination or a native oxide film on the surface thereof. The GaAs substrate 14 having a diameter of 50 to 150 mm is disposed in MOCVD equipment, and then each layer constituting the above-mentioned compound semiconductor layer 2 can be laminated by the epitaxial growth without removing the GaAs substrate 14 out from the MOCVD equipment. Further, large equipment which is commercially available such as rotation and revolution type equipment and fast rotation type equipment can be used as the MOCVD equipment.

When each layer of the above-mentioned compound semiconductor layer 2 is epitaxially grown, for example, trimethylaluminum (($CH_3)_3Al$), trimethylgallium (($CH_3)_3Ga$), and trimethylindium (($CH_3)_3In$) can be used as the raw materials of constituent elements belonging to Group III. Further, as a raw material for doping Mg, for example, biscyclopentadienyl magnesium (bis-($C_5H_5)_2Mg$) or the like can be used. Furthermore, as a raw material for doping Si, for example, Disilane ($Si_2H_6$) or the like can be used. Moreover, as the raw material of constituent elements belonging to Group V, phosphine ($PH_3$), arsine ($AsH_3$) or the like can be used. In addition, when p-type GaP is used as the electric current diffusion layer 8, the growth temperature of the electric current diffusion layer 8 may be 720 to 770° C. In the other layers, the growth temperature may be 600 to 700° C. The carrier concentration and the thickness of each layer, and temperature conditions may be appropriately selected.

The compound semiconductor layer 2 produced in this manner has excellent surface condition with lass crystal defects in spite of having the light-emitting layer 10. Further, the compound semiconductor layer 2 may be subjected to surface treatment such as polishing, depending on the element structure.

(Process of Bonding Transparent Substrate)

Next, the compound semiconductor layer 2 and the transparent substrate 3 are bonded to each other. During the bonding between the compound semiconductor layer 2 and the transparent substrate 3, first, the surface of the electric current diffusion layer 8 of the compound semiconductor layer 2 is polished into a mirror surface. Then, the transparent substrate 3 to be attached to the mirror-polished surface of the electric current diffusion layer 8 is prepared. The surface of the transparent substrate 3 is polished into a mirror surface before the transparent substrate 3 is bonded to the electric current diffusion layer 8. Then, the compound semiconductor layer 2 and the transparent substrate 3 are carried into a general semiconductor material attachment apparatus. Then, electrons collide with the two mirror-polished surfaces in a vacuum and neutral Ar beams are emitted to the two mirror-polished surfaces. Then, the two surfaces overlap each other in the attachment apparatus in a vacuum and a load is applied to the two surfaces. In this way, it is possible to bond the compound semiconductor layer and the transparent substrate at room temperature (see FIG. 4). With respect to the bonding, materials of bonded surfaces are preferably the same as each other in terms of stability of bonding condition.

In this manner, the bonding (attaching) at room temperature in a vacuum is most preferable. The bonding may be bonding with high-temperature treatment, pressure bonding under high pressure, or bonding with an adhesive agent.

(Process of Forming First and Second Electrodes)

Next, the n-type ohmic electrode 4, which is the first electrode, and the p-type ohmic electrode 5, which is the second electrode, are formed. In the formation of the n-type ohmic electrode 4 and the p-type ohmic electrode 5, first, the GaAs substrate 14 and the buffer layer 15 are selectively removed from the compound semiconductor layer 2 bonded to the transparent substrate 3 by an ammonia-based etchant. Then, the n-type ohmic electrode 4 is formed on the surface of the exposed contact layer 16. Specifically, for example, an AuGe film and a Ni alloy/Au are formed with an arbitrary thickness by a vacuum deposition method and are then patterned by a general photolithography method, thereby forming the n-type ohmic electrode 4b.

Then, the contact layer 16, the upper clad layer 11, the light-emitting layer 10, and the lower clad layer 9 are selectively removed to expose the electric current diffusion layer 8 and the p-type ohmic electrode 5 is formed on the surface of the exposed electric current diffusion layer 8. Specifically, for example, an AuBe/Au film is formed with an arbitrary thickness by the vacuum deposition method and is then patterned by the general photolithography method, thereby forming the p-type ohmic electrode 5. Then, a heat treatment is performed under the conditions of, for example, a temperature of 400 to 500° C. and a processing time of 5 to 20 minutes, thereby making an alloy. In this way, it is possible to form a low-resistance n-type ohmic electrode 4 and p-type ohmic electrode 5.

(Process of Processing Transparent Substrate)

Next, the transparent substrate 3 is processed. In the processing of the transparent substrate 3, first, a surface of the transparent substrate 3 is cut in a V-shape. In this case, the internal surface of the V-shaped groove is the inclined surface 3*b* that is inclined at an angle α with respect to the plane parallel to the light-emitting surface. Then, the transparent substrate 3 is diced into chips at a predetermined interval from the side of the compound semiconductor layer 2. The vertical surface 3*a* of the transparent substrate 3 is formed by dicing when the transparent substrate 3 is cut into chips.

In addition, the inclined surface 3*b* is formed on a side surface of the transparent substrate 3 so that the first and second electrodes are disposed within a region (see FIG. 1) in which the bottom surface 3B of the transparent substrate 3 after processing is projected when viewed from the top of the light-emitting diode.

A method of forming the inclined surface 3*b* is not particularly limited. For example, the methods according to the related art, such as a wet etching method, a dry etching method, a scribing method, and a laser processing method, may be combined with each other. It is most preferable to use a dicing method with high shape controllability and high productivity. The use of the dicing method makes it possible to improve manufacturing yield.

A method of forming the vertical surface 3*a* is not particularly limited. It is preferable that the vertical surface 3*a* be formed by a laser processing method, a scribing/breaking method or a dicing method. The use of the laser processing method or the scribing/breaking method makes it possible to reduce manufacturing costs. That is, it is not necessary to provide a cutting margin when the substrate is divided into chips and it is possible to manufacture a large number of light-emitting diodes. Therefore, it is possible to reduce manufacturing costs. On the other hand, the use of the dicing method exhibits excellent stability in cutting.

Finally, a fractured layer and contamination are removed by etching using a mixture of sulfuric acid and hydrogen peroxide. In this way, the light-emitting diode 1 is manufactured.

<Light-Emitting Diode Lamp>

Figure 5:
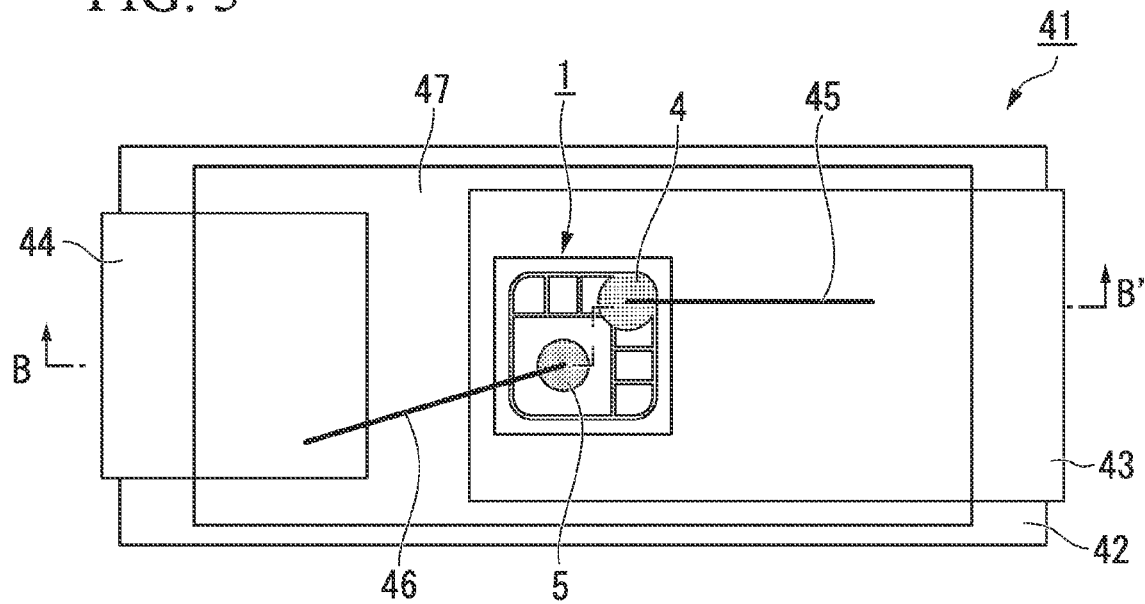
FIG. 5 is a plan view illustrating a light-emitting diode lamp using a light-emitting diode according to an embodiment of the invention.
Figure 6:
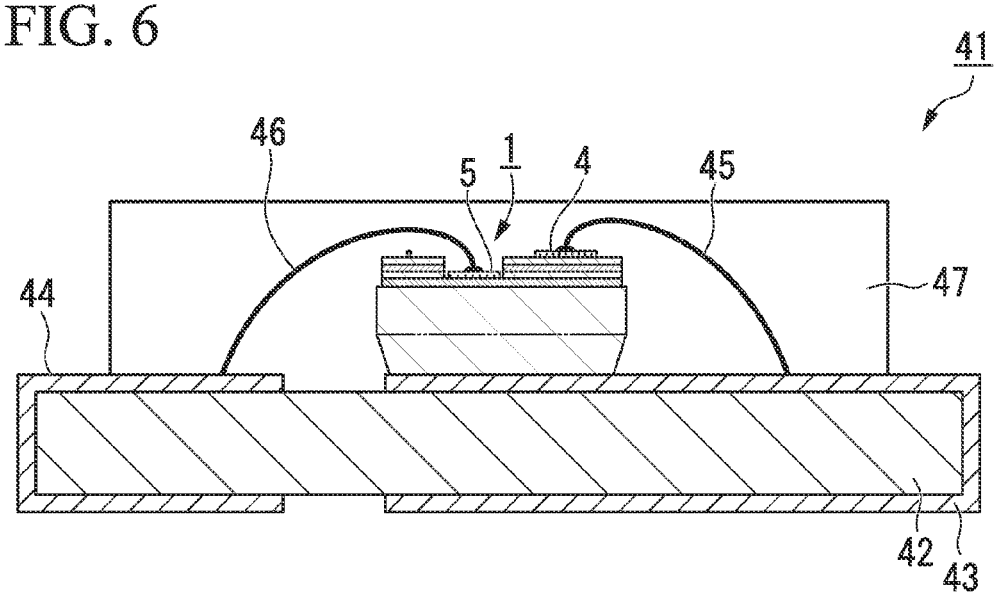
FIG. 6 is a cross-sectional view schematically illustrating a light-emitting diode lamp using a light-emitting diode according to an embodiment of the invention taken along the line B-B' of FIG. 5.

FIGS. 5 and 6 are diagrams illustrating a light-emitting diode lamp using a light-emitting diode according to an embodiment of the invention. FIG. 5 is a plan view and FIG. 6 is a cross-sectional view taken along the line B-B' of FIG. 5.

As shown in FIGS. 5 and 6, a light-emitting diode lamp 41 using a light-emitting diode 1 according to this embodiment includes one or more light-emitting diodes 1 mounted on the surface of a mounting substrate 42. Specifically, an n electrode terminal 43 and a p electrode terminal 44 are provided on the surface of the mounting substrate 42. An n-type ohmic electrode 4, which is a first electrode of the light-emitting diode 1, and an n electrode terminal 43 of the mounting substrate 42 are connected to each other by a gold wire 45 (wire bonding). A p-type ohmic electrode 5, which is a second electrode of the light-emitting diode 1, and a p electrode terminal 44 of the mounting substrate 42 are connected to each other by a gold wire 46. In addition, as shown in FIG. 6, the light-emitting diode 1 is connected to the n electrode terminal 43 by a connection layer (not shown) made of Ag paste, eutectic metal layer or the like so as to be fixed to the mounting substrate 42. The surface of the mounting substrate 42 on which the light-emitting diode 1 is mounted is sealed by a general sealant 47 such as an epoxy resin.

<Method for Manufacturing Light-Emitting Diode Lamp>

Next, a method for manufacturing the light-emitting diode lamp 41 using the above-mentioned light-emitting diode 1, that is, a method for mounting the light-emitting diode 1 will be described.

As shown in FIGS. 5 and 6, a predetermined number of light-emitting diodes 1 are mounted on the surface of the mounting substrate 42. In the mounting of the light-emitting diode 1, first, the light-emitting diode 1 is positioned relative to the mounting substrate 42 and the light-emitting diode 1 is arranged at a predetermined position on the surface of the mounting substrate 42. Then, a die bonding is conducted with Ag paste or the like to fix the light-emitting diode 1 to the surface of the mounting substrate 42. Then, the n-type ohmic electrode 4 of the light-emitting diode 1 is connected to the n electrode terminal 43 of the mounting substrate 42 by the gold wire 45 (wire bonding). Then, the p-type ohmic electrode 5 of the light-emitting diode 1 is connected to the p electrode terminal 44 of the mounting substrate 42 by the gold wire 46. Finally, the surface of the mounting substrate 42 on which the light-emitting diode 1 is mounted is sealed by the sealant 47. In this way, the light-emitting diode lamp 41 using the light-emitting diode 1 is manufactured.

In the light-emitting diode lamp 41 illustrated in FIGS. 5 and 6, according to the above-described configuration, a voltage applied between the n-electrode terminal 43 and the p-electrode terminal 44 is applied to the compound semiconductor layer 2 via the n-type ohmic electrode 4 that functions as the negative electrode and the p-type ohmic electrode 5 that functions as the positive electrode, and the light-emitting layer 10 emits light. The light emitted from the light-emitting layer 10 is discharged from the light-emitting surface of the light-emitting diode lamp 41.

Moreover, the light-emitting diode lamp using the above-mentioned light-emitting diode 1 can be used in any applications such as bullet type lamps for general applications, side view lamps for mobile device applications and top view lamps used in display devices.

Further, with respect to the above-configured light-emitting diode lamp 41, the mounting substrate 42 has a flat-plate shape in the example illustrated in FIGS. 5 and 6, but the present invention is not limited to this configuration, and other shapes may also be employed.

As described hereinabove, the light-emitting diode 1 of the present embodiment includes the n-type ohmic electrode (first electrode) 4 (4*a*, 4*b*) and the p-type ohmic electrode (second electrode) 5 are provided on the side of the main light-emitting surface 2*a* of the compound semiconductor layer 2, and the transparent substrate 3 includes: the upper surface 3A bonding to the compound semiconductor layer 2; the bottom surface 3B having smaller dimensions than dimensions of the upper surface 3A; and the side surface including at least inclined surface 3*b* inclined to the inside of the transparent substrate 3, wherein the n-type and p-type ohmic electrodes 4, 5 are disposed within a region in which the bottom surface 3B of the transparent substrate 3 is projected when viewed from the top of the light-emitting diode. Here, since a region (that is, a region in which the inclined surface 3*b* is projected) except a region in which the bottom surface 3B is projected exhibits high light emission efficiency, opaque n-type and p-type ohmic electrodes 4, 5 are not formed within the region in which the inclined surface 3b is projected. As a result, effective dimensions of a reflection surface can be ensured. Accordingly, since it is possible to enhance light emission efficiency from the light-emitting portion 7, an increase in the luminance of the light-emitting diode 1 may be achieved.

According to the method of the present embodiment for producing the light-emitting diode 1, in forming the inclined surface 3b on the side surface of the transparent substrate 3 bonded to the compound semiconductor layer 2, the inclined surface 3b is formed on the side surface of the transparent substrate 3 such that the bottom surface 3B of the transparent substrate 3 has smaller dimensions than dimensions of the upper surface 3A thereof bonding to the compound semiconductor layer 2, and such that n-type and p-type ohmic electrodes 4, 5 are disposed within a region in which the bottom surface 3B is projected when viewed from the top of the light-emitting diode 1.

Therefore, it is possible to produce the above-described high luminance light-emitting diode 1.

According to the light-emitting diode lamp 41 of the present embodiment, since the above light-emitting diode 1 of the present invention is mounted, it is possible to provide a high luminance light-emitting diode lamp.

EXAMPLES

Hereinafter, the invention will be described specifically based on examples. However, the invention is not limited to the examples.

Example 1

The semiconductor light-emitting diode manufactured in this example is a red light-emitting diode (LED) having an AlGaInP light-emitting portion according to the above-described embodiment illustrated in FIGS. 1 and 2.

In Example of the invention, a case in which an epitaxial laminated structure (epiwafer) provided on a GaAs substrate is bonded to a GaP substrate to manufacture a light-emitting diode will be described in detail.

The LED according to Example 1 was manufactured using an epitaxial wafer including semiconductor layers sequentially laminated on a semiconductor substrate which had a surface inclined at an angle of 15° with respect to the Si doped n-type (100) plane and was made of a GaAs single crystal. The laminated semiconductor layers were a Si-doped n-type GaAs buffer layer, a Si-doped n-type $(Al_{0.5}Ga_{0.5})_{0.5}In_{0.5}P$ contact layer, a Si-doped n-type $(Al_{0.7}Ga_{0.3})_{0.5}In_{0.5}P$ upper clad layer, an undoped light-emitting layer including 20 pairs of $(Al_{0.2}Ga_{0.8})_{0.5}In_{0.5}P/(Al_{0.7}Ga_{0.8})_{0.5}In_{0.5}P$, a Mg-doped p-type $(Al_{0.7}Ga_{0.3})_{0.5}In_{0.5}P$ lower clad layer, a thin $(Al_{0.5}Ga_{0.5})_{0.5}In_{0.5}P$ intermediate layer, and a Mg-doped p-type GaP layer.

In this example, each layer of the semiconductor layer was formed on the GaAs substrate by a reduced-pressure metal-organic chemical vapor deposition method (MOCVD method) using trimethylaluminum $((CH_3)_3Al)$, trimethylgallium $((CH_3)_3Ga)$ and trimethylindium $((CH_3)_3In)$ as a raw material of a group III element, thereby forming an epitaxial wafer. Biscyclopentadienyl magnesium $(bis-(C_5H_5)_2Mg)$ was used as a Mg-doped raw material. Silane $(Si_2H_6)$ may be used as a Si-doped raw material. Phosphine $(PH_3)$ or arsine $(AsH_3)$ was used as a raw material of a group V element. The GaP layer was grown at a temperature of 750° C. and the other semiconductor layers constituting the semiconductor layer were grown at a temperature of 730° C.

The carrier concentration of the GaAs buffer layer was about $2 \times 10^{18}$ cm$^{-3}$ and the thickness thereof was about 0.2 μm. The contact layer was made of $(Al_{0.5}Ga_{0.5})_{0.5}In_{0.5}P$ and had a carrier concentration of about $2 \times 10^{18}$ cm$^{-3}$ and a thickness of about 1.5 μm. The carrier concentration of the n-type clad layer was about $8 \times 10^{17}$ cm$^{-3}$ and the thickness thereof was about 1 μm. The light-emitting layer was not doped with impurities and had a thickness of 0.8 μm. The carrier concentration of the p-type clad layer was about $2 \times 10^{17}$ cm$^{-3}$ and the thickness thereof was 1 μm. The carrier concentration of the GaP layer was about $3 \times 10^{18}$ cm$^{-3}$ and the thickness thereof was 9 μm.

A region from the surface to a depth of about 1 μm in the p-type GaP layer was polished into a mirror surface. The roughness of the surface of the p-type GaP layer was 0.18 nm by the mirror-like finishing. An n-type GaP substrate to be adhered to the mirror-polished surface of the p-type GaP layer was prepared. A single crystal to which Si and Te were added such that the carrier concentration thereof was about $2 \times 10^{17}$ cm$^{-3}$, and having the plane orientation (111) was used for the GaP substrate for attachment. The diameter of the GaP substrate for attachment was 50 millimeters (mm) and the thickness thereof was 250 μm. The surface of the GaP substrate was polished into a mirror surface before the GaP substrate was bonded to the p-type GaP layer and the surface roughness (the root mean square (rms)) thereof was 0.12 nm.

The GaP substrate and the epitaxial wafer were carried in a general attachment apparatus and the apparatus was evacuated to $3 \times 10^{-5}$ Pa.

Then, Ar beams were emitted to both the surface of the GaP substrate and the surface of the GaP layer. Then, in the attachment apparatus that was maintained in vacuum, both the surfaces overlapped each other and a load was applied such that pressure against each of the surfaces was 20 g/cm². In this way, the GaP substrate and the GaP layer were bonded to each other at a room temperature.

Then, the GaAs substrate and the GaAs buffer layer were selectively removed from the bonded wafer by an ammonia-based etchant.

The n-type ohmic electrode (4b) was formed as the first linear ohmic electrode on the surface of the contact layer by a vacuum deposition method such that AuGe and a Ni alloy were formed with a thickness of 0.3 μm, and Au was formed with a thickness of 0.3 μm. The electrode was patterned by a general photolithography method, thereby forming the electrode.

Then, an epitaxial layer in a region in which the p electrode was formed was selectively removed such that the GaP layer was exposed. The p-type ohmic electrode was formed on the surface of the GaP layer by the vacuum deposition method such that AuBe was formed with a thickness of 0.2 μm and Au was formed with a thickness of 0.4 μm.

A heat treatment was performed at a temperature of 450° C. for 10 minutes to change the electrode into an alloy. In this way, low-resistance p-type and n-type ohmic electrodes (5) were formed.

Then, an electrode for wire bonding was formed on n electrode pad region (4a) and a pad region of p electrode (5) such that Au was formed with a thickness of 0.2 μm, Pt was formed with a thickness of 0.2 μm and Au was formed with a thickness of 1 μm.

Then, the compound semiconductor layer, which is to become a cutting region were removed by etching.

A dicing saw was used to cut the GaP substrate in a V shape from the rear surface of the GaP substrate (3B) such that the angle α of an inclined surface was 70° and the thickness of a first side surface (3a) was 160 μm.

Then, the GaP substrate was cut into chips at an interval of 320 μm from the front surface thereof by a dicing saw. A fractured layer and contamination caused by dicing were removed by etching using a mixture of sulfuric acid and hydrogen peroxide. In this way, the semiconductor light-emitting diode (chip) was manufactured.

The length of a first side surface in the vertical direction thereof was 160 μm. The inclined length of an inclined surface (3b) was 96 μm. A bottom surface was a substantially square shape with a side of about 250 μm, and an area of about 0.062 mm².

A upper surface surrounded by the first side surfaces was a square shape with a side of about 290 μm, and an area of 0.084 mm². The ratio of the bottom surface to the upper surface was 74%.

As shown in FIGS. 5 and 6, light-emitting diode lamps were assembled from the LED chips which had been manufactured in the above manner. The LED lamp was manufactured by fixing and supporting (mounting) the LED chip on the mounting substrate with a silver (Ag) paste, connecting the n-type ohmic electrode of the LED and the n electrode terminal provided on the surface of the mounting substrate with a gold wire using wire bonding, also connecting the p-type ohmic electrode and the p electrode terminal with a gold wire using wire bonding, and sealing the LED chip and the mounting substrate with a general epoxy resin. A hundred lamps were assembled, and characteristics and ratio of assembly defects thereof were evaluated.

A current was flowed between the n-type and p-type ohmic electrodes through the n electrode terminal and the p electrode terminal provided on the surface of the mounting substrate. As a result, red light with a dominant wavelength of 620 nm was emitted. The value of a forward voltage (Vf) when a forward current of 20 milliamperes (mA) flowed exhibited good ohmic characteristics of each ohmic electrode, and the average value of the forward voltage of 100 lamps was 2.0 volts (V). In addition, emission intensity when the forward current was 20 mA was 3.2 lumens, which was a high brightness value, since the emission efficiency of light to the outside was improved by the constitution of the light-emitting portion with high emission efficiency and by removing the fractured layer generated when a chip was cut. There were no assembly defects.

Comparative Example 1

With respect to LED according to Comparative Example 1, p-type and n-type ohmic electrodes were formed in the same manner as Example 1.

Then, the transparent substrate was cut from the rear surface of the LED, that is, from the side of the transparent substrate thereof such that the thickness of a first side surface was 30 μm. The transparent substrate was cut into chips at an interval of 320 μm from the front surface thereof by a dicing saw. A fractured layer and contamination caused by dicing were removed by etching using a mixture of sulfuric acid and hydrogen peroxide. In this way, the semiconductor light-emitting diode (chip) 21 as shown in FIGS. 7 and 8 was manufactured.

A hundred light-emitting diode lamps were assembled in the same manner as Example 1 from the LED chips 21 manufactured in the above manner.

Figure 7:
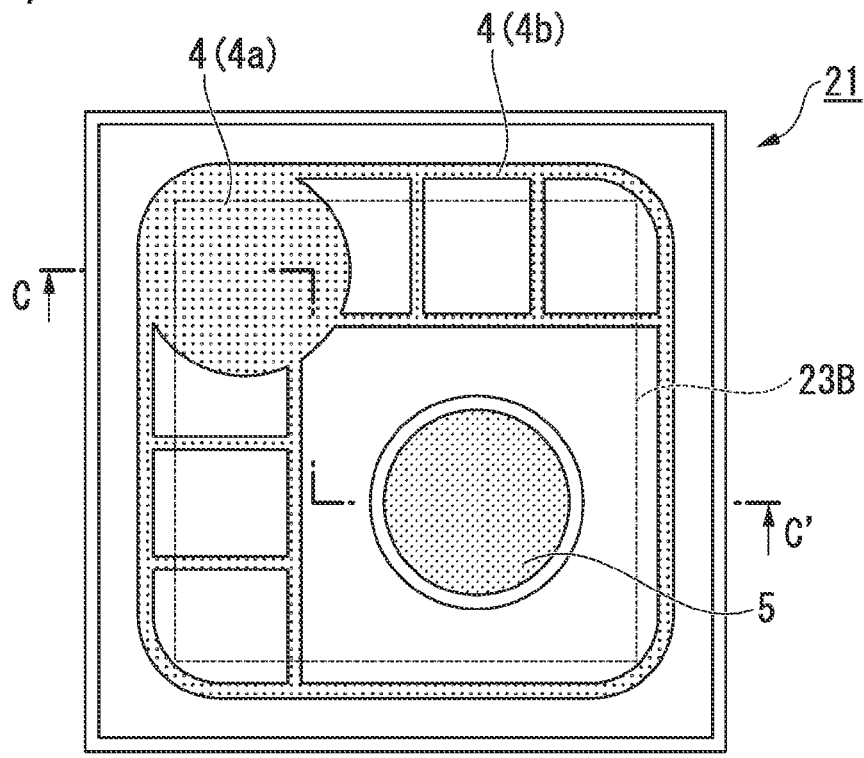
FIG. 7 is a plan view illustrating a configuration of a light-emitting diode according to Comparative Example 1.
Figure 8:
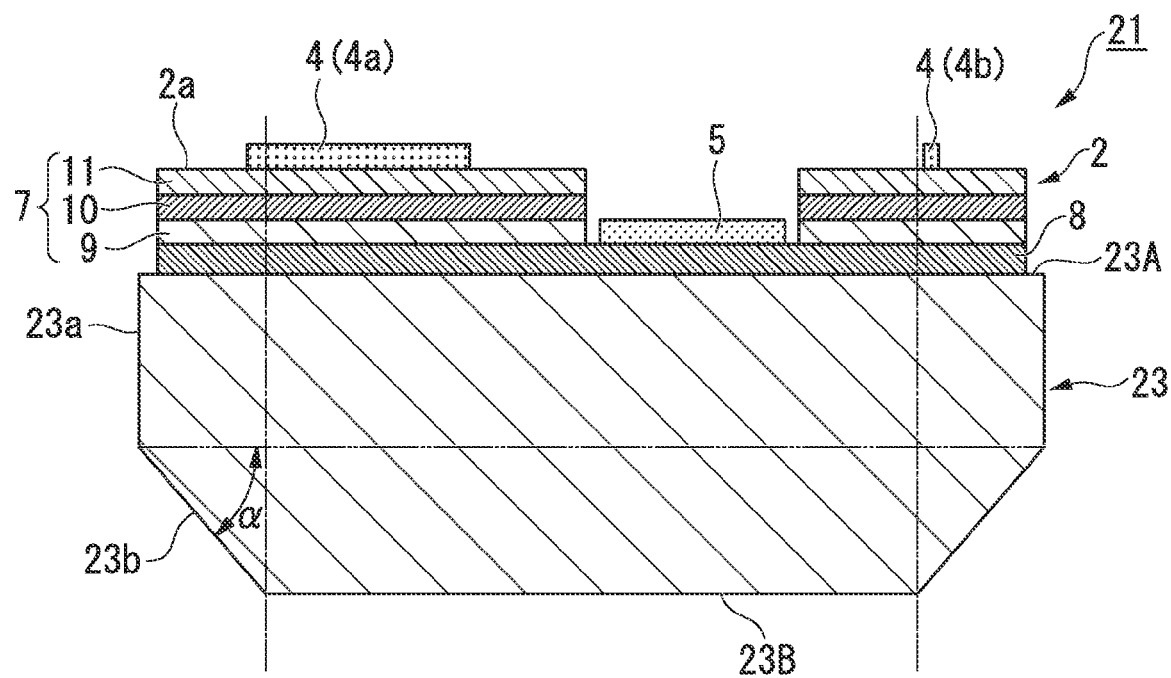
FIG. 8 is a cross-sectional view schematically illustrating a light-emitting diode according to Comparative Example 1 taken along the line C-C' of FIG. 7.

As shown in FIGS. 7 and 8, LED according to Comparative Example 1 had the length of the inclined surface 23b, which was the second side surface of the transparent substrate 23, in the inclined direction thereof longer than the length of the vertical surface 23a, which was the first side surface of the transparent substrate 23, in the vertical direction. The LED of Comparative Example 1 had dimensions of the bottom surface 23B of the transparent substrate 23 smaller than the bottom surface of the LED of Example 1. In addition, a pad electrode 4a and a linear electrode 4b were disposed within a region in which the inclined surface 23b of the transparent substrate 23 was projected when viewed from the top of the LED, that is, above the inclined surface 23b.

Specifically, α equaled to about 70 degrees. The length of the vertical surface 23a in the vertical direction thereof was 60 μm. The length of an inclined surface 23b in the inclined direction thereof was 200 μm. A bottom surface 23B was a substantially square shape with a side of about 150 μm, and the area thereof was about 0.023 mm².

On the other hand, the upper surface 23A surrounded by the vertical surfaces 23a which were the first side surfaces was a square shape with a side of about 290 μm, and the area thereof was 0.084 mm². Further, the ratio of the bottom surface 23B to the upper surface 23A was 27%.

A current was flowed between the n-type and p-type ohmic electrodes through the n electrode terminal and the p electrode terminal provided on the surface of the mounting substrate. As a result, red light with a dominant wavelength of 620 nm was emitted. The value of the forward voltage (Vf) when the forward current of 20 milliamperes (mA) flowed was 2.0 volts (V). In addition, the brightness when the forward current was 20 mA was 2.9 lumens. Two assembly defects occurred because two chips fell during the die bonding process.

The LED 21 according to Comparative Example 1 exhibited low brightness as compared to the Example 1 applying the invention, since electrodes 4 (4a, 4b) were formed above the bottom surface 23B. Since small bottom surface of Comparative Example 1 unbalance the Comparative Example 1, assembly defects occurred.

Comparative Example 2

With respect to LED according to Comparative Example 2, p-type and n-type ohmic electrodes were formed in the same manner as Example 1.

Then, the transparent substrate was cut into chips at an interval of 320 μm from the rear surface of the LED, that is, from the side of the transparent substrate thereof by a dicing saw. The LED according to Comparative Example 2 had no vertical surface which was the first side surface, and the side surface was formed by only inclined surface with the angle (α) of 85 degrees (refer to FIG. 10). Then, a fractured layer and contamination were removed by etching using a mixture of sulfuric acid and hydrogen peroxide. In this way, the semiconductor light-emitting diode (chip) 31 as shown in FIGS. 9 and 10 was manufactured.

A hundred light-emitting diode lamps were assembled in the same manner as Example 1 from the LED chips 31 manufactured in the above manner.

Figure 9:
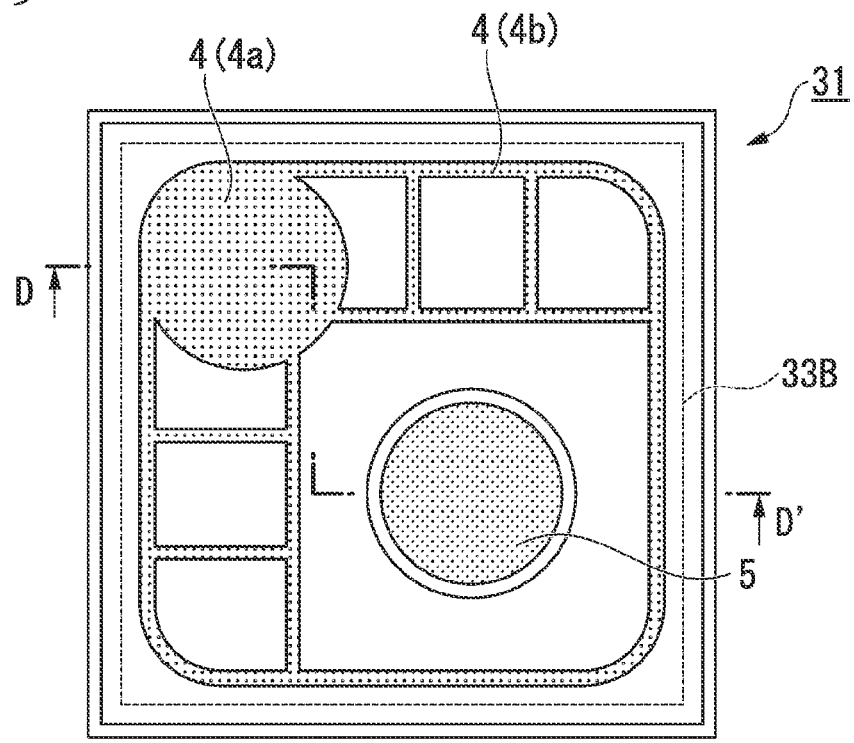
FIG. 9 is a plan view illustrating a configuration of a light-emitting diode according to Comparative Example 2.
Figure 10:
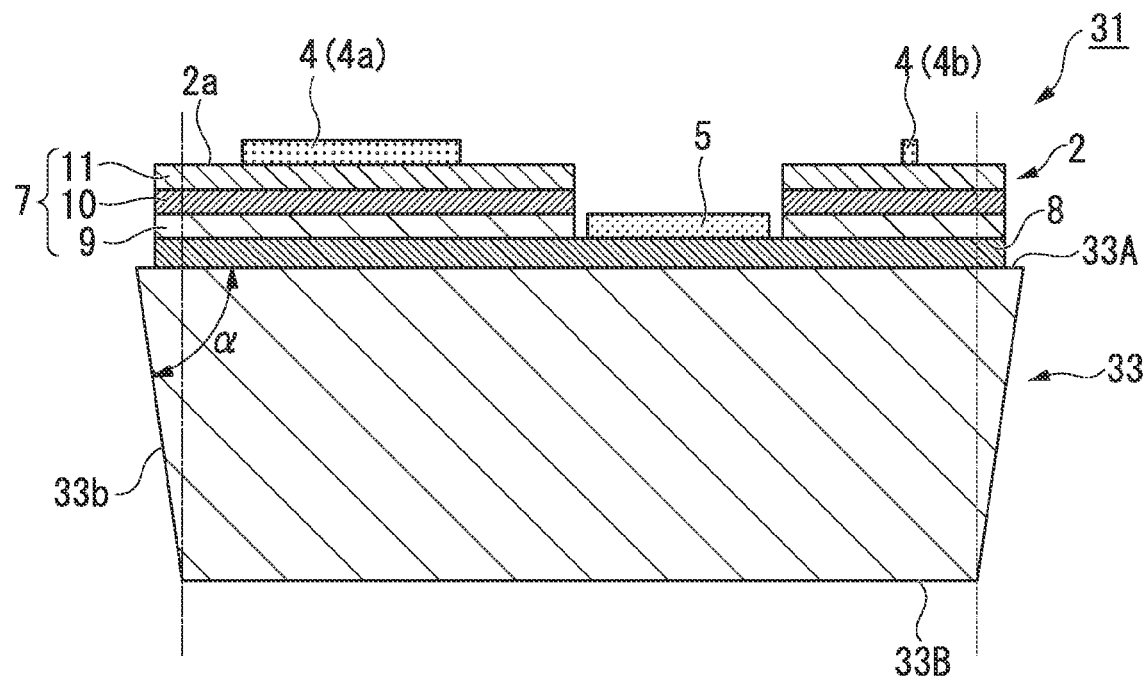
FIG. 10 is a cross-sectional view schematically illustrating a light-emitting diode according to Comparative Example 2 taken along the line D-D' of FIG. 9.

As shown in FIGS. 9 and 10, LED 32 according to Comparative Example 2 had the side surface of the transparent substrate 33, configured only by the inclined surface 33b. A pad electrode 4a and a linear electrode 4b were not disposed within a region in which the inclined surface 33b of the transparent substrate 33 was projected when viewed from the top of the LED 32, that is, above the inclined surface 33b.

Specifically, the length of a side of the bottom surface 33B was 290 μm, and the area thereof was 0.085 mm².

On the other hand, the upper surface 33A was a square shape with a side of about 310 μm, and the area thereof was 0.096 mm². Further, the ratio of the bottom surface 33B to the upper surface 33A was 88%.

A current was flowed between the n-type and p-type ohmic electrodes through the n electrode terminal and the p electrode terminal provided on the surface of the mounting substrate. As a result, red light with a dominant wavelength of 620 nm was emitted.

The value of a forward voltage (Vf) when a forward current of 20 milliamperes (mA) flowed was 2.0 volts (V). In addition, the brightness when the forward current was 20 mA was 2.6 lumens. There were no assembly defects.

The LED 31 according to Comparative Example 2 exhibited low brightness as compared to the Example 1 applying the invention, since having large inclined angle α.

Example 2

In Example of the invention, an infrared light-emitting diode (LED) having the same configuration as Example 1 and in which a material of a light-emitting layer is AlGaAs light-emitting portion will be described.

In Example of the invention, similarly to Example 1, with respect to the case in which an epitaxial laminated structure (epiwafer) provided on a GaAs substrate is bonded to a GaP substrate to manufacture a light-emitting diode, a light-emitting diode of Example 2 was manufactured in the same manner as Example 1 except a manufacturing process of a light-emitting portion.

A light-emitting portion of LED according to Example 2 was configured by a Si-doped n-type $(Al_{0.7}Ga_{0.3})_{0.5}In_{0.5}P$ upper clad layer, $Al_{0.3}Ga_{0.7}As$ upper guide layer, well layers/barrier layers including a pair of $Al_{0.03}Ga_{0.97}As/Al_{0.2}Ga_{0.8}As$, $Al_{0.3}Ga_{0.7}As$ lower guide layer and a Mg-doped p-type $(Al_{0.7}Ga_{0.3})_{0.5}In_{0.5}P$ lower clad layer.

The upper clad layer was made to have a carrier concentration of about $1\times10^{18}$ cm$^{-3}$ and a thickness of about 0.5 μm. The upper guide layer was made to be undoped and to have a thickness of about 50 nm. The well layer was made to be undoped and to be $Al_{0.03}Ga_{0.97}As$ with a thickness of about 17 nm. The barrier layer was made to be undoped and to be $Al_{0.2}Ga_{0.8}As$ with a thickness of about 19 nm. Further, 18 pairs of well layers and barrier layers were alternately laminated. The lower guide layer was made to be undoped and to have a thickness of about 50 nm. The lower clad layer was made to have a carrier concentration of about $8\times10^{17}$ cm$^{-3}$ and a thickness of about 0.5 μm.

As shown in FIGS. 5 and 6, similarly to Example 1, a hundred lamps were assembled from the LED chips which had been manufactured in the above manner, and the characteristics and ratio of assembly defects thereof were evaluated.

When a current was flowed between the n-type and p-type ohmic electrodes, infrared light with a dominant wavelength of 830 nm was emitted. A forward voltage (Vf) when a forward current of 20 milliamperes (mA) flowed was 1.9 volts since the resistance of a bonding interface between the electric current diffusion layer of the compound semiconductor layer and the functional substrate was low and each ohmic electrode had good ohmic characteristics. The light-emitting power when the forward current was 20 mA was 18 mW. Further, there were no assembly defects.

Example 3

In Example of the invention, an infrared light-emitting diode (LED) having the same configuration as Example 1 and in which a material of a light-emitting layer is InGaAs light-emitting portion will be described.

In Example of the invention, similarly to Example 1, with respect to the case in which an epitaxial laminated structure (epiwafer) provided on a GaAs substrate is bonded to a GaP substrate to manufacture a light-emitting diode, a light-emitting diode of Example 3 was manufactured in the same manner as Example 1 except a manufacturing process of a light-emitting portion.

A light-emitting portion of LED according to Example 3 was configured by a Si-doped n-type $(Al_{0.7}Ga_{0.3})_{0.5}In_{0.5}P$ upper clad layer, $(Al_{0.3}Ga_{0.7})_{0.52}In_{0.48}P$ upper guide layer, well layer/barrier layer including 5 pairs of $In_{0.2}Ga_{0.8}As/(Al_{0.1}Ga_{0.9})_{0.55}In_{0.45}P$, $(Al_{0.3}Ga_{0.7})_{0.52}In_{0.48}P$ lower guide layer and a Mg-doped p-type $(Al_{0.7}Ga_{0.3})_{0.5}In_{0.5}P$ lower clad layer.

The upper clad layer was made to have a carrier concentration of about $1\times10^{18}$ cm$^{-3}$ and a thickness of about 0.5 μm. The upper guide layer was made to be undoped and to have a thickness of about 50 nm. The well layer was made to be undoped and to be $In_{0.2}Ga_{0.8}As$ with a thickness of about 5 nm. The barrier layer was made to be undoped and to be $(Al_{0.1}Ga_{0.9})_{0.55}In_{(0.45)}P$ with a thickness of about 10 nm. Further, five pairs of well layers and barrier layers were alternately laminated. The lower guide layer was made to be undoped and to have a thickness of about 50 nm. The lower clad layer was made to have a carrier concentration of about $8\times10^{17}$ cm$^{-3}$ and a thickness of about 0.5 μm.

As shown in FIGS. 5 and 6, similarly to Example 1, a hundred lamps were assembled from the LED chips which had been manufactured in the above manner, and the characteristics and ratio of assembly defects thereof were evaluated.

Characteristics of the light-emitting diodes (light-emitting diode lamps) were evaluated. When a current was flowed between the n-type and p-type ohmic electrodes, infrared light with a dominant wavelength of 920 nm was emitted. A forward voltage (Vf) when a forward current of 20 milliamperes (mA) flowed was about 1.22 volts (V) since the resistance of a bonding interface between the electric current diffusion layer of the compound semiconductor layer and the functional substrate was low and each ohmic electrode had good ohmic characteristics. The light-emitting power when the forward current was 20 mA was 8 mW. Further, there were no assembly defects.

Comparative Example 3

A light-emitting diode of Comparative Example 3 was manufactured by the manufacturing process (shape of chip) of Comparative Example 2, using AlGaAs light-emitting portion of Example 2.

A current was flowed between the n-type and p-type ohmic electrodes through the n electrode terminal and the p electrode terminal provided on the surface of the mounting substrate. As a result, red light with a peak wavelength of 830 nm was emitted. The value of a forward voltage (Vf) when a forward current of 20 milliamperes (mA) flowed was 1.9 volts (V). In addition, the light-emitting power when the forward current was 20 mA was 15 mW. One assembly defect occurred because a chip fell during the die bonding process.

The LED according to Comparative Example 3 exhibited low power as compared to the Example 2 applying the invention, since electrodes 4 (4a, 4b) were formed above the bottom surface. Since a small bottom surface of Comparative Example 3 unbalance the Comparative Example 3, the Comparative Example 3 had assembly defects.

Comparative Example 4

A light-emitting diode of Comparative Example 4 was manufactured by the manufacturing process (shape of chip) of Comparative Example 2, using the InGaAs light-emitting portion of Example 3.

A current was flowed between the n-type and p-type ohmic electrodes through the n electrode terminal and the p electrode terminal provided on the surface of the mounting substrate. As a result, red light with a peak wavelength of 920 nm was emitted. The value of a forward voltage (Vf) when a forward current of 20 milliamperes (mA) flowed was 1.22 volts (V). In addition, the light-emitting power when the forward current was 20 mA was 6.5 mW. Two assembly defects occurred because two chips fell during the die bonding process.

The LED according to Comparative Example 4 exhibited low power as compared to the Example 3 applying the invention, since electrodes 4 (4a, 4b) were formed above the bottom surface. Since small bottom surface of Comparative Example 4 unbalance the Comparative Example 4, assembly defects occurred.

INDUSTRIAL APPLICABILITY

The light-emitting diode according to the invention can emit infrared, red, orange, yellow, or yellowish green light and has high brightness. Therefore, the light-emitting diode according to the invention can be used as various kinds of display lamps, light sources for sensor and lighting devices.

REFERENCE SIGNS LIST

1: LIGHT-EMITTING DIODE
2: COMPOUND SEMICONDUCTOR LAYER
2a: LIGHT-EMITTING SURFACE
3: TRANSPARENT SUBSTRATE
3A: UPPER SURFACE
3B: BOTTOM SURFACE
3a: VERTICAL SURFACE (FIRST SIDE SURFACE)
3b: INCLINED SURFACE (SECOND SIDE SURFACE)
4: n-TYPE OHMIC ELECTRODE (FIRST ELECTRODE)
5: p-TYPE OHMIC ELECTRODE (SECOND ELECTRODE)
7: LIGHT-EMITTING PORTION
8: ELECTRIC CURRENT DIFFUSION LAYER
9: LOWER CLAD LAYER
10: LIGHT-EMITTING LAYER
11: UPPER CLAD LAYER
14: GaAs SUBSTRATE
15: BUFFER LAYER
16: CONTACT LAYER
41: LIGHT-EMITTING DIODE LAMP
42: MOUNTING SUBSTRATE
43: n ELECTRODE TERMINAL
44: p ELECTRODE TERMINAL
45, 46: WIRE
47: SEALANT

What is claimed is:
1. A light-emitting diode comprising:
a compound semiconductor layer including a light-emitting portion containing a light-emitting layer consisting of a composition formula $(Al_XGa_{1-X})_YIn_{1-Y}P(0 \leq X \leq 1, 0 < Y \leq 1)$, $Al_XGa_{1-X}As(0 \leq X \leq 1)$, or $In_XGa_{1-X}As (0 \leq X \leq 0.3)$; and
a transparent substrate,
wherein the compound semiconductor layer and the transparent substrate are bonded, and
a first electrode and a second electrode having a polarity different from that of the first electrode are provided on the side of a main light-emitting surface of the compound semiconductor layer,
wherein the transparent substrate comprises:
an upper surface bonding to the compound semiconductor layer;
a bottom surface having smaller dimensions than dimensions of the upper surface; and
a side surface including at least inclined surface inclined from the side of the upper surface toward the side of the bottom surface,
wherein the first and second electrodes are disposed within a region in which the bottom surface is projected when viewed from the top of the light-emitting diode, and not disposed within a region in which the inclined surface of the transparent substrate is projected when viewed from the top of the light-emitting diode.

2. The light-emitting diode according to claim 1, wherein the dimensions of the bottom surface is in a range of 60% to 80% for the dimensions of the upper surface.

3. The light-emitting diode according to claim 1, wherein the area of the bottom surface is 0.04 mm² or more.

4. The light-emitting diode according to claim 1, wherein the transparent substrate is a GaP single crystal.

5. The light-emitting diode according to claim 1, wherein the transparent substrate has a thickness of 50 μm to 300 μm.

6. The light-emitting diode according to claim 1, wherein the first electrode comprises a pad electrode and a linear electrode with a width equal to or less than 10 μm.

7. The light-emitting diode according to claim 1, wherein the compound semiconductor layer comprises a GaP layer, and
the second electrode is provided on the GaP layer.

8. The light-emitting diode according to claim 1, wherein the polarity of the first electrode is negative, and the polarity of the second electrode is positive.

9. A light-emitting diode lamp, which mounts a light-emitting diode according to claim 1.

10. The light-emitting diode according to claim 1, wherein the side surface of the transparent substrate further comprises:
a first side surface, being substantially vertical to the main light-emitting surface, in the side of the upper surface bonding the compound semiconductor layer,
wherein the inclined surface is inclined to the main light-emitting surface, in the side of the bottom surface.

11. The light-emitting diode according to claim 10, wherein the angle between the inclined surface and the main light-emitting surface is in a range of 60° to 80°.

12. The light-emitting diode according to claim 10, wherein the length of the first side surface in the vertical direction thereof is longer than the length of the inclined surface in the inclined direction thereof, when viewed in the cross-section of the light-emitting diode.

13. The light-emitting diode according to claim 2, wherein the inclined surface is roughened.

14. A method of producing a light-emitting diode, the method comprising:
forming a compound semiconductor layer including a light-emitting portion containing a light-emitting layer consisting of a composition formula $(Al_XGa_{1-X})_YIn_{1-Y}P$ ($0 \leq X \leq 1, 0 < Y \leq 1$), $Al_XGa_{1-X}As$ ($0 \leq X \leq 1$), or $In_XGa_{1-X}As$ ($0 \leq X \leq 0.3$) on a GaAs substrate;

bonding the compound semiconductor layer and a transparent substrate;

removing the GaAs substrate;

forming a first electrode and a second electrode having a polarity different from that of the first electrode on a main light-emitting surface which is in the opposite side of the transparent substrate of the compound semiconductor layer; and forming an inclined surface on a side surface of the transparent substrate, wherein in forming the inclined surface, the inclined surface is formed on a side surface of the transparent substrate such that a bottom surface of the transparent substrate has smaller dimensions than dimensions of an upper surface thereof bonding to the compound semiconductor layer, and such that the first and second electrodes are disposed within a region in which the bottom surface is projected when viewed from the top of the light-emitting diode, and not disposed within a region in which the inclined surface of the transparent substrate is projected when viewed from the top of the light-emitting diode.

15. The method of producing a light-emitting diode according to claim 14, wherein in forming the inclined surface, a first side surface being substantially vertical to the light-emitting surface is formed in the side of the upper surface of the transparent substrate bonding the compound semiconductor layer, and a second side surface inclined to the light-emitting surface is formed in the side of the bottom surface.

16. The method of producing a light-emitting diode according to claim 14, wherein in forming the inclined surface, dicing method is used.

\* \* \* \* \*